United States Patent
Hu et al.

(10) Patent No.: US 11,736,126 B1
(45) Date of Patent: Aug. 22, 2023

(54) DOUBLE FACTOR CORRECTION TURBO DECODING METHOD BASED ON SIMULATED ANNEALING ALGORITHM

(71) Applicant: Dalian Maritime University, Dalian (CN)

(72) Inventors: Qing Hu, Dalian (CN); Chensong Zhao, Dalian (CN)

(73) Assignee: DALIAN MARITIME UNIVERSITY, Dalian (CN)

(\*) Notice: Subject to any disclaimer, the term of this patent is extended or adjusted under 35 U.S.C. 154(b) by 0 days.

(21) Appl. No.: 18/302,263

(22) Filed: Apr. 18, 2023

Related U.S. Application Data

(63) Continuation of application No. PCT/CN2022/138609, filed on Dec. 13, 2022.

(30) Foreign Application Priority Data

Dec. 20, 2021 (CN) .......................... 202111567091.3

(51) Int. Cl.
*H03M 13/27* (2006.01)
*H03M 13/37* (2006.01)
*H03M 13/45* (2006.01)

(52) U.S. Cl.
CPC ................... *H03M 13/2771* (2013.01); *H03M 13/3746* (2013.01); *H03M 13/45* (2013.01)

(58) Field of Classification Search
CPC ......... H03M 13/2771; H03M 13/3746; H03M 13/45
See application file for complete search history.

(56) References Cited

U.S. PATENT DOCUMENTS

2004/0240590 A1\* 12/2004 Cameron ................ H04L 1/005
375/340

OTHER PUBLICATIONS

Zhiliang Qin et al., "Turbo multiuser detection based on simulated annealing", 2008 3rd IEEE Conference on Industrial Electronics and Applications, Singapore, 2008, pp. 1858-1863.
ISA (CNIPA), Wriiten Opinion for PCT/CN2022/138609, dated Feb. 21, 2023.

\* cited by examiner

*Primary Examiner* — Thien Nguyen
(74) *Attorney, Agent, or Firm* — Zhigang Ma

(57) ABSTRACT

A double factor correction Turbo decoding method based on a simulated annealing algorithm is provided, including: S1: setting an initial bit error rate $P_{e0}$ and an initial solution of correction factors; S2: randomly selecting a new solution of the correction factors from a proximal subset of a current solution, and calculating a new bit error rate $P_{enew}$; S3: determining whether the new bit error rate is smaller than a bit error rate of a previous decoding, and if so, receiving the new solution of the correction factors, otherwise calculating a reception probability based on a difference between the new bit error rate and the bit error rate of the previous decoding; S4: decreasing the initial bit error rate $P_{e0}$ to determine whether a termination condition is satisfied, performing S5 if the termination condition is satisfied, otherwise performing S2; and S5: outputting a current solution of the correction factors as an optimal solution.

4 Claims, 2 Drawing Sheets

DOUBLE FACTOR CORRECTION TURBO DECODING METHOD BASED ON SIMULATED ANNEALING ALGORITHM

TECHNICAL FIELD

The disclosure relates to the technical field of marine ship information processing, in particular to a double factor correction Turbo decoding method based on a simulated annealing algorithm.

BACKGROUND

In the prior art, for maritime wireless communication systems, there is a lot of research on a link layer, a network layer, and hardware devices of a very high frequency (VHF) data exchange system (VDES), but there is insufficient research on the feasibility of a physical layer, especially a decoding algorithm. Communication of ship-ship and ship-shore is a crucial link for marine vessels. When a ship is sailing at sea, a driver not only needs to grasp a speed and a direction of the ship, but also has a huge demand for communication information such as maritime information and navigation data. However, nowadays, spectrum resources of an offshore frequency band have been seriously insufficient, and a data link of an automatic identification system (AIS) has been overloaded, which results in information transmission congestion and adverse impacts on maritime navigation safety. Therefore, an engineering research on a physical layer of a VDE-terrestrial (VDE-TER) platform is urgent.

Since the parallel concatenated coding and decoding scheme of Turbo code was first proposed in 1993, Turbo code has become one of main coding methods in 3G mobile communication. In the prior art, there are generally three popular decoding algorithms: a Map algorithm, a Log Map algorithm, and a Max Log Map algorithm. Among them, a maximum posterior probability algorithm, also known as BCJR algorithm, is the foundation of Map class algorithms. The algorithm has a large amount of computation, and although the calculation results are more accurate than the latter two, it is not conducive to engineering implementation. Based on this, the Log Map algorithm rewrites a large number of multiplication and division operations of the Map algorithm into addition and subtraction operations in the form of log, which greatly improves operational efficiency and minimizes decoding performance losses. Based on the Log Map algorithm, the Max Log Map algorithm ignores a correction process, and thus eliminates a significant portion of the computational process, which improves the efficiency of decoding operations, while also decreasing the decoding performance.

SUMMARY

According to the technical problems that the existing Turbo code decoding methods proposed above cannot take into account both operational efficiency and decoding performance at the same time, a double factor correction Turbo decoding method based on a simulated annealing algorithm is provided. The double factor correction Turbo decoding method adds a double factor correction mechanism to an original Turbo decoding method, and obtains a double factor optimal solution through the simulated annealing algorithm, thereby achieving a purpose of reducing a bit error rate.

The technical solutions of the disclosure include:

S1: setting an initial bit error rate $P_{e0}$ and an initial solution $x_0(sf_1, sf_2)$ of correction factors, $sf_1$ being a first correction factor, and $sf_2$ being a second correction factor;

S2: randomly selecting a new solution of the correction factors from a proximal subset of the current solution of the correction factors, and calculating a new bit error rate $P_{enew}$ after correcting a Turbo decoding algorithm based on the new solution of the correction factors;

S3: determining whether the new bit error rate is smaller than a bit error rate of a previous decoding, in response to the new bit error rate being smaller than the bit error rate of the previous decoding; receiving the new solution of the correction factors; and in response to the new bit error rate being not smaller than the bit error rate of the previous decoding, calculating a reception probability based on a difference between the new bit error rate and the bit error rate of the previous decoding, and receiving the new solution of the correction factors based on the reception probability;

S4: decreasing the initial bit error rate $P_{e0}$ at a preset rate, determining whether a termination condition is satisfied, and performing S5 if the termination condition is satisfied, or performing S2 if the termination is not satisfied; and S5: outputting the current solution of the correction factors as an optimal solution while the termination condition is met.

In an embodiment, first prior information and second prior information are obtained by following formulas:

$$L_{a1\_new} = L_{a1} * sf1$$

$$L_{a2\_new} = L_{a2} * sf2$$

where $L_{a1\_new}$ represents the first prior information, $L_{a1}$ represents de-interleaved information obtained by de-interleaving extrinsic information outputted by a second soft-in soft-out (SISO) decoder during a previous iterative decoding process, sf1 represents the first correction factor, $L_{a2\_new}$ represents the second prior information, $L_{a2}$ represents interleaved information obtained by interleaving extrinsic information outputted by a first SISO decoder during the previous iterative decoding process, and sf2 represents the second correction factor.

In an embodiment, calculating the reception probability based on the difference between the new bit error rate and the bit error rate of the previous decoding is achieved by following formulas:

$$\Delta P_e = P_{enew}(x_{new}(sf_1, sf_2)) - P_{e0}(x_0(sf_1, sf_2))$$

$$P = \begin{cases} 1, & \Delta P_e < 0 \\ e^{-\frac{\Delta P_e}{P_{e0}}}, & \Delta P_e > 0 \end{cases}$$

where $P_{enew}(x_{new}(sf_1, sf_2))$ represents the new bit error rate, $x_{new}(sf_1, sf_2)$ represents the new solution of the correction factors, $P_{e0}(x_0(sf_1, sf_2))$ is the initial bit error rate, $x_0(sf_1, sf_2)$ is the initial solution of the correction factors, and P is the reception probability.

In an embodiment, correcting the Turbo decoding algorithm based on the new solution of the correction factors includes:

inputting verification information and system information outputted by an encoder into a Turbo decoder structure including a first SISO decoder and a second SISO decoder; and wherein the first SISO decoder is a decoder for performing SISO decoding on system information, first verification information, and first prior information received during a current iterative decoding process; the second SISO decoder is a decoder for performing the SISO decoding on interleaved system information obtained by interleaving the system information, second verification information, and second prior information received during the current iterative decoding process; the first prior information is obtained by correcting de-interleaved information obtained by de-interleaving extrinsic information outputted by the second SISO decoder during a previous iterative decoding process using the first correction factor; and the second prior information is information is obtained by correcting interleaved information obtained by interleaving extrinsic information outputted by the first SISO decoder during the previous iterative decoding process using the second correction factor.

Compared with the prior art, the disclosure has following advantages:

1. The disclosure adds two correction factors to a Turbo code decoding algorithm to achieve a better decoding effect. Through a simulated annealing algorithm in machine learning, an optimal solution of the two correction factors can be selected within an effective range. The disclosure can achieve an adaptive selection of the two correction factors and is of great significance for the performance research and engineering application of decoding algorithms.

2. The disclosure performs operations of different parts based on the VDE-TER platform, complementing research on decoding methods for the platform.

BRIEF DESCRIPTION OF DRAWINGS

In order to more clearly illustrate the embodiments of the disclosure or the technical solutions in the prior art, the following will briefly introduce attached drawings needed in the description of the embodiments or the prior art. It is apparent that these attached drawings in the following description are some embodiments of the disclosure. For those skilled in the art, other attached drawings can be obtained from these attached drawings without creative work.

DETAILED DESCRIPTION OF EMBODIMENTS

In order to enable those skilled in the art to better understand the technical solutions of the disclosure, the following will provide a clear and complete description of the technical solutions in the embodiments of the disclosure in combination with attached drawings. Apparently, the described embodiments are only a part of the embodiments of the disclosure, not all of them. Based on the embodiments in the disclosure, all other embodiments obtained by those ordinary skilled in the art without creative work should fall within the scope of protection of the disclosure.

A double factor correction Turbo decoding method based on a simulated annealing algorithm includes following five steps S1~S5.

S1: setting an initial bit error rate $P_{e0}$ and an initial solution $x_0(sf_1, sf_2)$ of correction factors, $sf_1$ being a first correction factor, and $sf_2$ being a second correction factor.

S2: randomly selecting a new solution of the correction factors from a proximal subset of a current solution of the correction factors, and calculating a new bit error rate $P_{enew}$ after correcting a Turbo decoding algorithm based on the new solution of the correction factors.

In an embodiment, in the new solution of the correction factors, a random number in $[sf_1-0.2, sf_1+0.2]$ is taken as the first correction factor, and a random number in $[sf_2-0.2, sf_2+0.2]$ is taken as the second correction factor. Here, $sf_1$ is the first correction factor of the current solution of the correction factors, and $sf_2$ is the second correction factor of the current solution of the correction factors.

Figure 1:
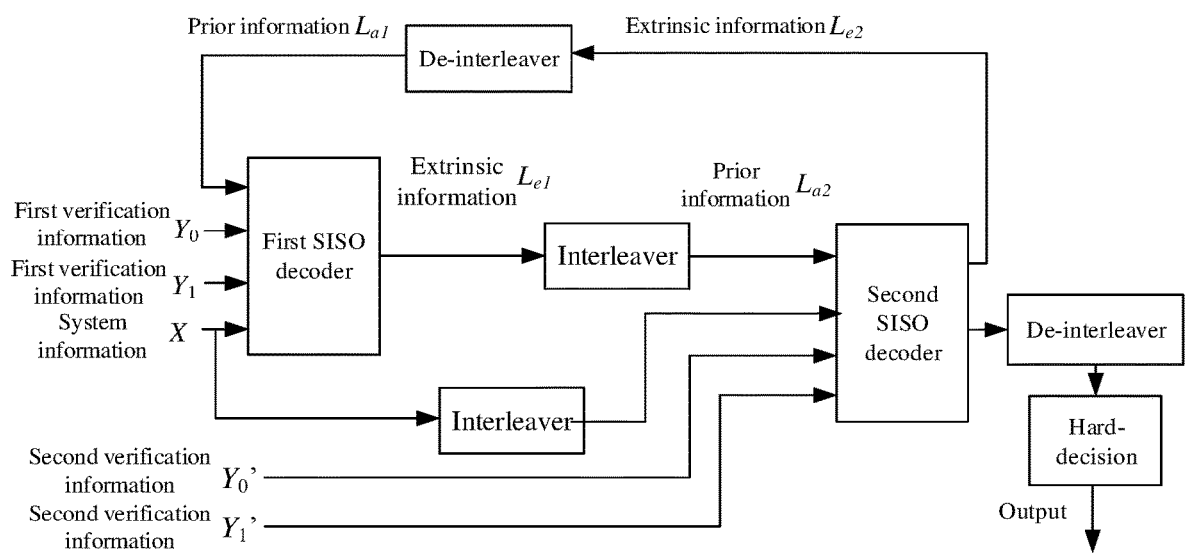
FIG. 1 illustrates a Turbo decoder structure of the disclosure.

The disclosure performs decoding based on the Turbo decoder structure shown in FIG. 1. The Turbo decoder structure includes a first SISO decoder and a second SISO decoder. Specifically, the first SISO decoder is a decoder that performs SISO decoding on system information X, first verification information $Y_0$ and $Y_1$, and first prior information $L_{a1}$ received during a current iterative decoding process. The second SISO decoder is a decoder that performs the SISO decoding on interleaved system information obtained by interleaving the system information X, second verification information $Y_{0'}$ and $Y_{1'}$, and second prior information $L_{a2}$ received during the current iterative decoding process. The first prior information is obtained by correcting de-interleaved information which is obtained by de-interleaving extrinsic information $L_{e2}$ outputted by the second SISO decoder during a previous iterative decoding process using the first correction factor; and the second prior information is information is obtained by correcting interleaved information which is obtained by interleaving extrinsic information $L_{e1}$ outputted by the first SISO decoder during the previous iterative decoding process using the second correction factor. The first prior information and the second prior information are obtained by following formulas:

$$L_{a1\_new} = L_{a1} * sf1$$

$$L_{a2\_new} = L_{a2} * sf2$$

where $L_{a1\_new}$ represents the first prior information, $L_{a1}$ represents de-interleaved information obtained by de-interleaving extrinsic information outputted by the second SISO decoder during the previous iterative decoding process, sf1 represents the first correction factor, $L_{a2\_new}$ represents the second prior information, $L_{a2}$ represents interleaved information obtained by interleaving extrinsic information outputted by the first SISO decoder during the previous iterative decoding process, and sf2 represents the second correction factor.

In the VDE-TER platform, information sequences are outputted from the descrambler and enter the decoder structure after zero-padding operations. The decoding is performed iteratively by the first SISO decoder and the second SISO decoder. The first SISO decoder and the second SISO decoder correspond to RSC1 and RSC2 in the encoder, respectively.

S3: determining whether the corrected bit error rate is smaller than a bit error rate of a previous decoding, in response to the new bit error rate being smaller than the bit error rate of the previous decoding, receiving the new solution of the correction factors as the current solution of the correction factors; and in response to the new bit error rate being not smaller than the bit error rate of the previous decoding, calculating a reception probability based on a difference between the new bit error rate and the bit error rate of the previous decoding, and receiving the new solution of the correction factors based on the reception probability.

Specifically, the difference between the corrected bit error rate and the bit error rate of the previous decoding is achieved by following formulas:

$$\Delta P_e = P_{enew}(x_{new}(sf_1, sf_2)) - P_{e0}(x_0(sf_1, sf_2))$$

where $P_{enew}(x_{new}(sf_1, sf_2))$ represents the new bit error rate, $x_{new}(sf_1, sf_2)$ represents the new solution of the correction factors, $P_{e0}(x_0(sf_1, sf_2))$ represents the initial bit error rate, and $x_0(sf_1, sf_2)$ represents the initial solution of the correction factors.

If $\Delta P_e < 0$, the new solution $x_{new}(sf_1, sf_2)$ is received as a current solution, otherwise determining whether to receive the new solution according to the reception probability calculated in a following formula:

$$P = \begin{cases} 1, & \Delta P_e < 0 \\ e^{-\frac{\Delta P_e}{P_{e0}}}, & \Delta P_e > 0 \end{cases}$$

where P represents the reception probability.

S4: decreasing the initial bit error rate $P_{e0}$ at a preset rate (also referred to as an annealing rate) to determine whether a termination condition is satisfied, and performing S5 if the termination condition is satisfied, or performing S2 if the termination condition is not satisfied.

S5: outputting a current solution of the correction factors as an optimal solution while the termination condition is satisfied.

The technical solutions of the disclosure will be further explained through a specific embodiment.

Figure 2:
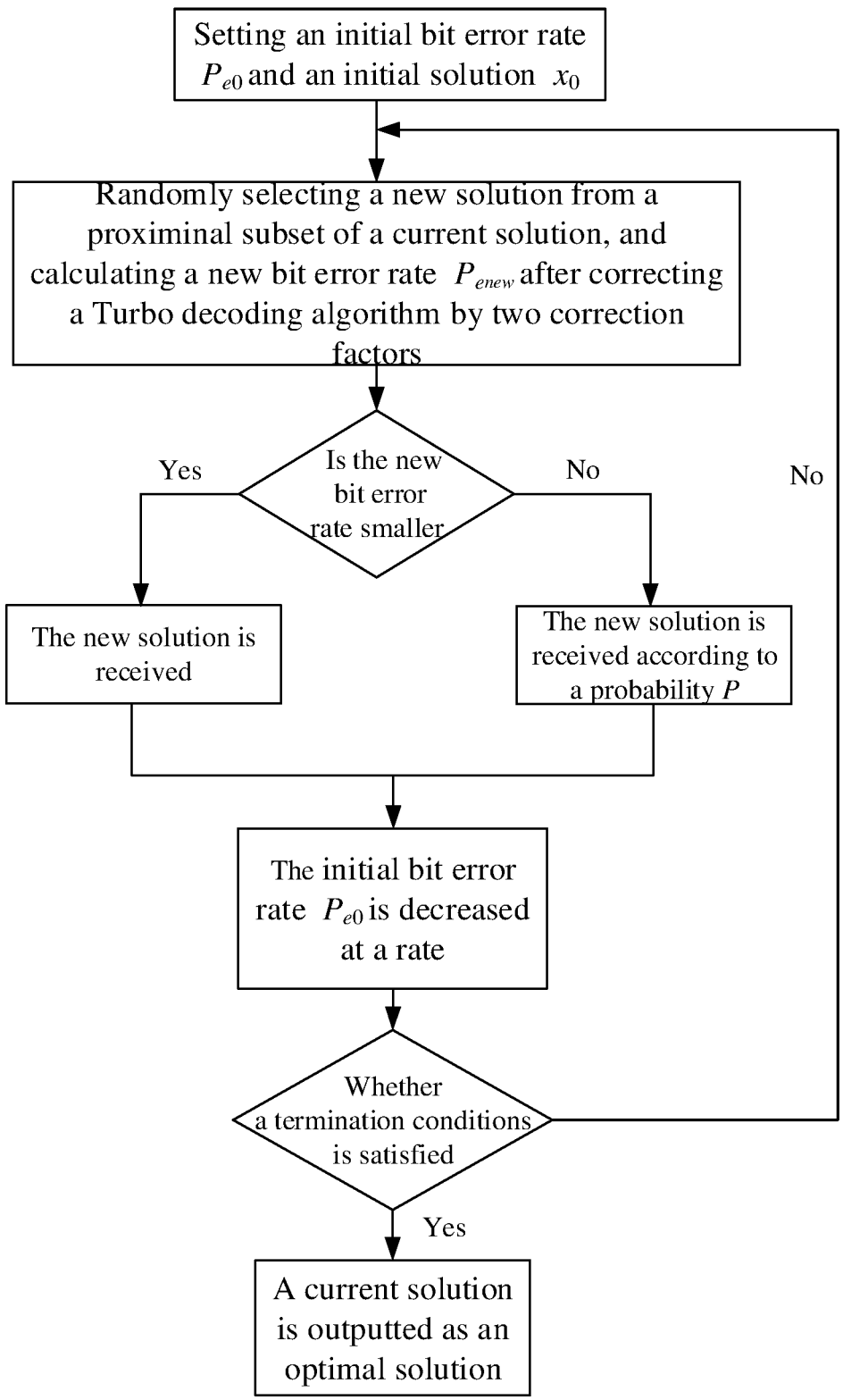
FIG. 2 illustrates a flowchart of a double factor correction Turbo decoding method based on a simulated annealing algorithm of the disclosure.

A generation matrix of Turbo code used in the disclosure is G=[1 0 1 1; 1 1 0 1; 1 1 1 1], and the encoder adopts a rescursive system code (RSC) structure. The decoder structure is shown in FIG. 1, with an iteration number of 8. In the embodiment, the link ID in an international telecommunication union-1139 (ITU-1139) is configured as a 19 channel, with a signal-to-noise ratio of 4 dB, a data length of 5376 bits, and a code rate of 3/4. Factor correction is applied to the extrinsic information in the decoder. Correction results of the extrinsic information generated by decoder 1 and decoder 2 are shown in formula (I). The detail of the correction method is shown in the flowchart FIG. 2.

$$L_{a1\_new} = L_{a1} * sf1$$

$$L_{a2\_new} = L_{a2} * sf2 \quad (I)$$

The specific embodiment includes following steps.

In step (1), each physical value is initialized, $P_{e0}$ is set to 1, N is set to 100, both $sf_1$ and $sf_2$ in $x_0(sf_1, sf_2)$ are set to 1, and $\alpha$ is set to 0.85. $\alpha$ represents an annealing rate, N represents a total number of iterations of the simulated annealing algorithm, and n represents a current number of iterations of the simulated annealing algorithm.

In step (2), for n=1, 2, ..., N, steps (3) to (5) are performed.

In step (3), a random number in $[sf_1-0.2, sf_1+0.2]$ is taken as a current first correction factor $sf_1$, and a random number in $[sf_2-0.2, sf_2+0.2]$ is taken as a current second correction factor $sf_2$, thereby to obtain a new solution $x_n(sf_1, sf_2)$. A current bit error rate $P_{e_n}$ is obtained by calculating Turbo codes corrected by the current first correction factor $sf_1$ and current second correction factor $sf_2$, and a difference between the current bit error rate and a bit error rate of the previous decoding is calculated by a formula: $\Delta P_e = P_{e_n}(x_n(sf_1, sf_2)) - P_{e_{n-1}}(x_{n-1}(sf_1, sf_2))$. In the embodiment, n=1, $sf_1=1$, $sf_2=0.8$, $P_{e0}(x_0(1, 1))=0.0881$, $P_{e0}(x_1(sf_1, sf_2))=0.0742$, $\Delta P_e=-0.0139$.

In step (4), if $\Delta P_e < 0$, the new solution $x_n(sf_1, sf_2)$ is taken as a current solution, otherwise determining whether to receive the new solution according to the reception probability calculated in a following formula (II), Apparently, the new solution $x_1$ (1, 0.8) is received in the embodiment;

$$P = \begin{cases} 1, & \Delta P_e < 0 \\ e^{-\frac{\Delta P_e}{P_{e0}}}, & \Delta P_e > 0 \end{cases} \quad (II)$$

In step (5), the current solution is outputted as an optimal solution if a termination condition is met, and the program is ended.

In step (6), the initial bit error rate $P_{e0}$ is decreased with the annealing rate $\alpha$, so that $P_{e0}$ is set to $\alpha * P_{e0}$, and the program is ended if $P_{e0} < 0$. Otherwise, step (2) is performed.

In the embodiment, $P_{e0}$ used for a next iteration is set to 0.85 according to $P_{e0} = \alpha * P_{e0}$, then step (2) is repeated for the next iteration.

Step (3) is performed, n=2, $sf_1=1$, $sf_2=0.6$, $P_{e1}(x_1(1, 0.8))=0.0742$, $P_{e2}(x_2(sf_1, sf_2))=0.0807$, $\Delta P_e=0.0065$.

Step (4) is performed, and a new solution is received with a reception probability of 0.992.

Step (6) is performed, and $P_{e0}$ used for a next iteration is set to 0.7225 according to $P_{e0} = \alpha * P_{e0}$, then step (2) is repeated until the termination condition is satisfied.

In the embodiment, the termination condition is that the total number of iterations of the simulated annealing algorithm reaches the preset maximum (i.e., n=N=100), or a lower limit of the bit error rate meets the requirements (i.e., $P_{e0} < 0$).

Finally, it should be noted that the above embodiments are only used to illustrate the technical solutions of the disclosure, not to limit it. Although the disclosure has been described in detail with the above embodiments, those skilled in the art should understand that they can still change the technical solutions in the above embodiments, or equivalently replace some or all of the technical features therein. These modifications or substitutions based on the nature of the technical solutions should also belong to the scope of protection of the disclosure.

What is claimed is:

1. A double factor correction Turbo decoding method based on a simulated annealing algorithm, comprising:
   S1: setting an initial bit error rate $P_{e0}$ and an initial solution $x_0(sf_1, sf_2)$ of correction factors, $sf_1$ being a first correction factor, and $sf_2$ being a second correction factor;
   S2: randomly selecting a new solution of the correction factors from a proximal subset of a current solution of the correction factors, and calculating a new bit error rate $P_{e_{new}}$ after correcting a Turbo decoding algorithm based on the new solution of the correction factors;
   S3: determining whether the new bit error rate is smaller than a bit error rate of a previous decoding; in response to the new bit error rate being smaller than the bit error rate of the previous decoding, receiving the new solution of the correction factors; and in response to the new bit error rate being not smaller than the bit error rate of the previous decoding, calculating a reception probability based on a difference between the new bit error rate and the bit error rate of the previous decoding, and receiving the new solution of the correction factors based on the reception probability;

S4: decreasing the initial bit error rate $P_{e0}$ at a preset rate, determining whether a termination condition is satisfied, and performing S5 if the termination condition is satisfied, or performing S2 if the termination condition is not satisfied; and S5: outputting the current solution of the correction factors as an optimal solution.

2. The double factor correction Turbo decoding method based on the simulated annealing algorithm according to claim 1, wherein first prior information and second prior information are obtained by following formulas:

$$L_{a1\_new} = L_{a1} * sf1$$

$$L_{a2\_new} = L_{a2} * sf2$$

where $L_{a1\_new}$ represents the first prior information, $L_{a1}$ represents de-interleaved information obtained by de-interleaving extrinsic information outputted by a second soft-in soft-out (SISO) decoder during a previous iterative decoding process, sf1 represents the first correction factor, $L_{a2\_new}$ represents the second prior information, $L_{a2}$ represents interleaved information obtained by interleaving extrinsic information outputted by a first SISO decoder during the previous iterative decoding process, and sf2 represents the second correction factor.

3. The double factor correction Turbo decoding method based on the simulated annealing algorithm according to claim 1, wherein calculating the reception probability based on the difference between the new bit error rate and the bit error rate of the previous decoding is achieved by following formulas:

$$\Delta P_e = P_{enew}(x_{new}(sf_1,sf_2)) - P_{e0}(x_0(sf_1,sf_2))$$

$$P = \begin{cases} 1, & \Delta P_e < 0 \\ e^{-\frac{\Delta P_e}{P_e 0}}, & \Delta P_e > 0 \end{cases}$$

where $P_{enew}(x_{new}(sf_1,sf_2))$ represents the new bit error rate, $x_{new}(sf_1, sf_2)$ represents the new solution of the correction factors, $P_{e0}(x_0(sf_1,sf_2))$ represents the initial bit error rate, $x_0(sf_1,sf_2)$ represents the initial solution of the correction factors, and P represents the reception probability.

4. The double factor correction Turbo decoding method based on the simulated annealing algorithm according to claim 1, wherein correcting the Turbo decoding algorithm based on the new solution of the correction factors comprises:

inputting verification information and system information outputted by an encoder into a Turbo decoder structure comprising a first SISO decoder and a second SISO decoder; and wherein the first SISO decoder is a decoder for performing SISO decoding on system information, first verification information, and first prior information received during a current iterative decoding process; the second SISO decoder is a decoder for performing the SISO decoding on interleaved system information obtained by interleaving the system information, second verification information, and second prior information received during the current iterative decoding process; the first prior information is obtained by correcting de-interleaved information obtained by de-interleaving extrinsic information outputted by the second SISO decoder during a previous iterative decoding process using the first correction factor; and the second prior information is obtained by correcting interleaved information obtained by interleaving extrinsic information outputted by the first SISO decoder during the previous iterative decoding process using the second correction factor.

* * * * *